United States Patent [19]

Stengl et al.

[11] Patent Number: 4,459,498

[45] Date of Patent: Jul. 10, 1984

[54] SWITCH WITH SERIES-CONNECTED MOS-FETS

[75] Inventors: Jens-Peer Stengl; Hartmut Thomas; Jenö Tihanyi, all of Munich, Fed. Rep. of Germany

[73] Assignee: Siemens Aktiengesellschaft, Berlin and Munich, Fed. Rep. of Germany

[21] Appl. No.: 277,891

[22] Filed: Jun. 26, 1981

[30] Foreign Application Priority Data

Jul. 9, 1980 [DE] Fed. Rep. of Germany ....... 3026040

[51] Int. Cl.³ .................. H03K 17/08; H03K 17/687; H03K 19/094
[52] U.S. Cl. .................. 307/584; 307/270; 307/577; 307/566
[58] Field of Search ............... 307/570, 571, 575, 577, 307/584, 585, 481, 254, 304, 270, 565, 566; 330/297

[56] References Cited

U.S. PATENT DOCUMENTS 3,585,403 6/1971 Gribbons.
3,622,899 11/1971 Eisenberg .................. 330/297 X
4,367,421 1/1983 Baker ........................ 307/571

FOREIGN PATENT DOCUMENTS 1403249 8/1975 United Kingdom.

OTHER PUBLICATIONS

Hoffman, "*Daving V-MOS power FETs*", Electron, No. 174, pp. 20-21, 4-24-79.
Heinzer, "*Don't Trade Off Analog-Switch Specs*" Electronic Design, pp. 56-61, 7-19-77.
Kooi et al, "*MOS Moves into Higher Power Applications*", Electronics pp. 98-103 6-24-76.
Ibid p. 101 right column, paragraph 3-5, FIG. 5b, Siliconix Inc., Santa Clara, Calif.

Primary Examiner—Larry N. Anagnos
Assistant Examiner—David R. Bertelson
Attorney, Agent, or Firm—Herbert L. Lerner; Laurence A. Greenberg

[57] ABSTRACT

Switch with at least two series-connected MOS-FETs has a drain terminal of a preceding MOS-FET connected to a source terminal of a succeeding MOS-FET the MOS-FETs having respective control terminals connectible to a control voltage. The control terminal of the preceding MOS-FET is directly connected to a terminal of the control voltage source. The control terminal of the succeeding MOS-FET is connected to the control terminal of the respective preceding MOS-FET via a diode poled in forward direction with respect to the control voltage source. A resistor is connected between the control terminal and the source terminal of the succeeding MOS-FET.

2 Claims, 3 Drawing Figures

SWITCH WITH SERIES-CONNECTED MOS-FETS

The invention relates to a switch with at least two series-connected MOS-FETs and, more particularly, to such a switch wherein a drain terminal of a preceding MOS-FET is connected to the source terminal of the succeeding MOS-FET and the control terminals of the MOS-FETs are connectible to a control voltage source.

Such switches are employed for switching voltages which are higher than the breakdown voltage i.e. higher than the maximum cut-off or reverse voltage of an individual MOS-FET. Such a switch is described in the journal "Electronics" of June 24, 1976, Page 101, FIG. 5b. It obtains the drive power thereof in the open condition from a capacitive voltage divider which is connected to a fixed voltage. The control voltage is switched by a logic circuit with which a separate power supply is associated. A control voltage source must, in turn, be provided for switching the logic circuit.

Construction of the just-described drive circuit therefore requires considerable expense. It is an object of the invention to provide a switch of the type mentioned at the introduction hereto at lower expense than for heretofore known switches of that general type.

With the foregoing and other objects in view, there is provided, in accordance with the invention, a switch with at least two series-connected MOS-FETs, wherein a drain terminal of a preceding MOS-FET is connected to a source terminal of a succeeding MOS-FET, and the MOS-FETs have respective control terminals connectible to a control voltage source, comprising means for directly connecting the control terminal of the preceding MOS-FET to a terminal of the control voltage source; means for connecting the control terminal of the succeeding MOS-FET to the control terminal of the respective preceding MOS-FET via a diode poled in forward direction with respect to the control voltage source; and a resistor connected between the control terminal and the source terminal of the succeeding MOS-FET.

In accordance with another feature of the invention there is provided further succeeding MOS-FETs, and additional resistors respectively connected between the control terminal and the respective source terminals of the further succeeding MOS-FETs.

In accordance with a further feature of the invention, the diode has a cut-off voltage which is at least as high as the cut-off voltage of the succeeding MOS-FET.

In accordance with an additional feature of the invention there is provided a Zener diode connected between the control terminal and the drain terminal of the succeeding FET, the Zener diode being poled in cut-off direction with respect to the drain-source voltage source, the Zener diode having a Zener voltage which is lower than the cut-off voltage of the succeeding FET, the Zener diode being connected in series with a further diode having a flow direction which is opposite that the the Zener diode.

In accordance with an added feature of the invention there is provided further succeeding MOS-FETs, and additional Zener diodes respectively connected between the control terminal and the respective drain terminals of the further succeeding MOS-FETs, the additional Zener diodes, respectively, being serially connected with additional diodes, respectively, having a flow direction which is opposite that of the additional Zener diodes.

In accordance with a concomitant feature of the invention, the diode of the succeeding FET is connected to a drain terminal of an auxiliary FET, the control terminal of the preceding FET is connected to a control terminal of the auxiliary FET, and a source terminal of the auxiliary FET is connected to a terminal of an auxiliary voltage source.

Other features which are considered as characteristic for the invention are set forth in the appended claims.

Although the invention is illustrated and desired herein as embodied in switch with series-connected MOS-FETs, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing, in which.

Figure 1:
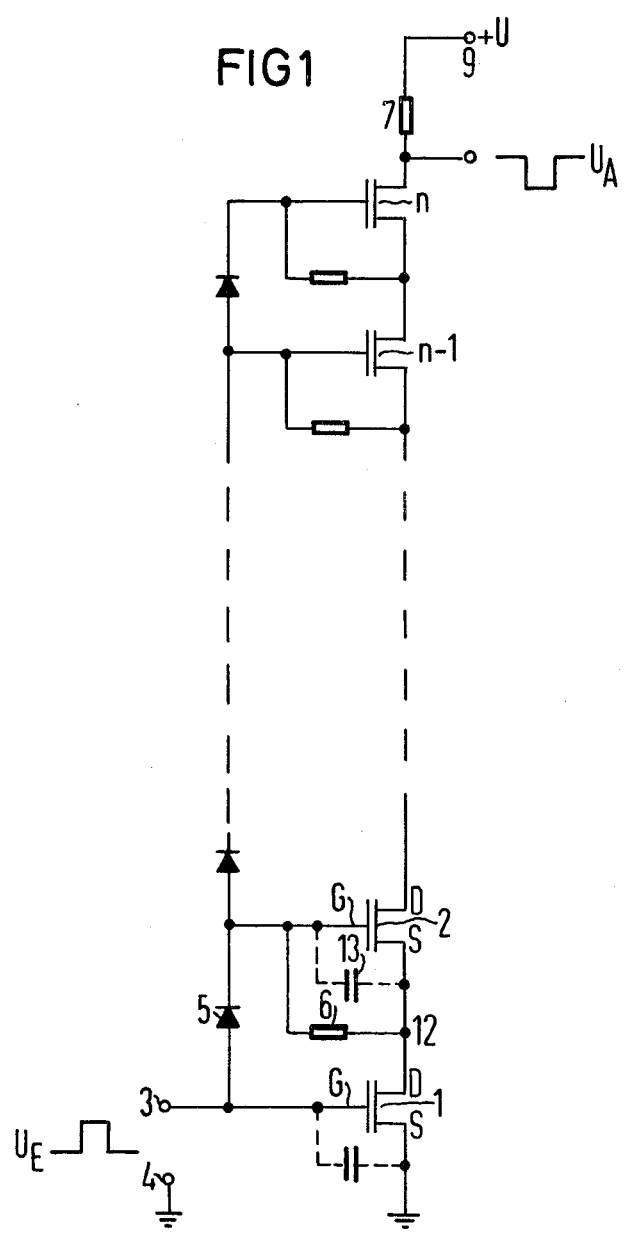
FIG. 1 is a circuit diagram of a first embodiment of a switch with at least two series-connected MOS-FETs constructed in accordance with the invention.

Referring now to the drawing and first, particularly, to FIG. 1 of the drawing, there is shown schematically a switch according to the invention having at least two series-connected power MOS-FETs 1 and 2, the drain terminal D of the FET 1 being connected to the source terminal S of the FET 2. The control terminal G of the FET 1 is connected to an input terminal 3. A second input terminal 4 is at the potential of the source terminal S. The control terminal G of the FET 1 is connected to the control terminal G of the FET 2 via a diode 5. The diode has a cut-off voltage which is at least as high as the breakdown voltage $U_{BD}$ of the FET 2. The control terminal G of the second FET 2 is electrically connected to the source terminal S thereof via a resistor 6. The junction point of the resistor 6 and the source terminal S is identified by reference numeral 12. Shunted across the resistor is the input capacitance 13 of the FET 2, which is shown symbolically by broken-line connections.

For higher blocking voltages, further MOS-FETs can be connected in series as is indicated by FETs n-1 and n. A load resistor 7, which is connected to a positive supply voltage +U via a terminal 9, is connected in series with the FETs.

If a positive voltage pulse $U_E$ of, for example, 5 V is applied to the input terminals 3 and 4, the first FET 1 is opened if the input capacitance 13 thereof is charged at least to the cut-off voltage. If the FET 1 becomes conducting, the potential at the point 12 drops. If the potential at the point 12 has dropped so low that the potential at the control terminal G of the FET 2 is lower than the input voltage $U_E$ plus the threshold voltage of the diode 5, then the diode 5 begins to conduct and the capacitance 13 is charged up. If the voltage in the capacitance 13 exceeds the cut-off voltage of the FET 2, the latter also becomes conducting. This process is continued until the last one of the series-connected FETs is switched into conduction. Then the full output voltage $U_A$ is present at the load resistor 7. Since the switch-on time of an individual power MOS-FET, for example, for 500 volts blocking voltage, is in the order of magnitude of 100 ns, the switch can be turned on i.e. closed, rapidly even with a large number of series-connected MOS-FETs.

To open the switch, the input voltage is switched off, whereby the FET 1 is cut off. The potential at the point 12 then rises, the diode 5 is cut off and the input capacitance 13 can discharge via the resistor 6. If the voltage at the input capacitance 13 drops below the cut-off voltage, then also the FET 2 cuts off. To attain a brief switch-off time, the resistor 6 which is selected must be so small that the capacitance 13 is discharged in a period of time which is short when compared to the time period of the switching cycle. On the other hand, the resistor 6 must be so large, however, that the control current flowing through the diode 5 experiences a voltage drop which is sufficient for opening the FET 2. As an example for a switch for 1000 V with two FETs for 500 V blocking voltage, respectively, the resistor 6 had a value of 100 ohms. For a capacitance 13 of 5 nF, a switching frequency of about 100 kHz can be attained therewith.

Figure 2:
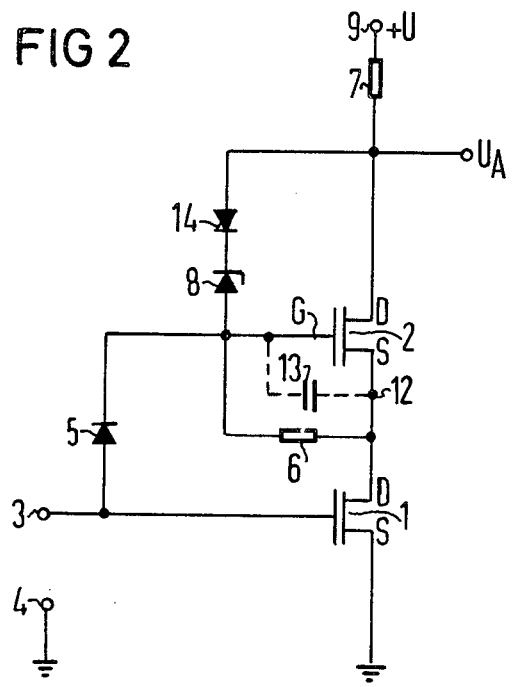
FIG. 2 is a second embodiment of FIG. 1 having two MOS-FETs.

A prerequisite for the operation or functioning of the switch according to FIG. 1 is that the transistor or transistors which remain cut off at the moment of switch-on can withstand or endure a voltage applied thereto and the flowing current even if they go into avalanche breakdown. If the current would not be withstood in the breakdown, the switch can easily be modified as shown in FIG. 2. The switch of FIG. 2 differs from that according to FIG. 1 by a Zener diode 8, which is connected between the drain terminal D and the control terminal G of the FET 2, and to which a diode 14 is connected with opposite polarity. This Zener diode 8 has a Zener voltage which is slightly smaller (for example 480 V) than the breakdown voltage of the FET 2. If an input voltage is applied to the input terminals 3 and 4, the FET 1 is switched into conduction. The potential at the point 12 then drops and a current can flow via the load resistor 7 through the Zener diode 8 to the point 12. The Zener diode 8 then breaks through immediately, and the breakthrough current through the Zener diode 8 produces a voltage drop in the resistor 6 which charges the input capacitance of the FET 2. When the cut-off voltage is exceeded, the FET 2 becomes conducting without having the entire operating voltage applied thereto. If the voltage applied to the FET 2 drops below the Zener voltage, the Zener diode 8 cuts off and the FET 2 is kept conducting via the diode 5.

When the switch is opened i.e. disconnected, the FET 1 is cut off and the Zener diode 8 goes into the cut-off state. The diode 5 is likewise cut off and the input capacitance can discharge via the resistor 6. The FET 2 is therby also cut off.

Figure 3:
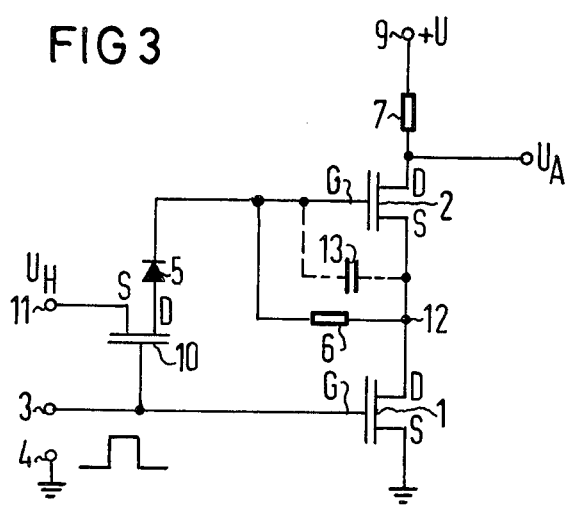
FIG. 3 is a third embodiment of the switch in accordance with the invention.

In order to relieve the control voltage source power-wise, the control voltage fed to the terminals 3 and 4 can be used for driving an auxiliary MOS-FET 10 as shown in FIG. 3. The source terminal of the auxiliary MOS-FET 10 is connected to a terminal 11, to which an auxiliary voltage $+U_H$ is connected. The drain terminal of the auxiliary FET 10 is connected to the diode 5. When a positive control voltage is applied to the terminals 3 and 4, the FET 1 and the auxiliary FET 10 are opened. A current required for charging up the input capacitance of the FET 2 can then flow through the diode 5 if the potential at the point 12 has dropped sufficiently. With this circuit arrangement, several series-connected MOS-FETs can likewise be switched on. Switching off is effected in the same manner as described in conjunction with FIGS. 1 and 2.

We claim:

1. Switch with at least two series-connected MOS-FETs, wherein a drain terminal of a preceding MOS-FET is connected to a source terminal of a succeeding MOS-FET, and the MOS-FETs have respective control terminals connectible to a control voltage source, comprising means for directly connecting the control terminal of the preceding MOS-FET to a terminal of the control voltage source; means for connecting the control terminal of the succeeding MOS-FET to the control terminal of the respective preceding MOS-FET via a diode poled in forward direction with respect to the control voltage source; a resistor connected between the control terminal and the source terminal of the succeeding MOS-FET; and a Zener diode connected between the control terminal and the drain terminal of the succeeding FET, said Zener diode being poled in cut-off direction with respect to the drain-source voltage source, said Zener diode having a Zener voltage which is lower than the cut-off voltage of the succeeding FET, said Zener diode being connected in series with a further diode having a flow direction which is opposite that of said Zener diode.

2. Switch according to claim 1, including further succeeding MOS-FETs with a Zener diode respectively connected between the control terminal and the respective drain terminal of each of said further succeeding MOS-FETs, said Zener diode being serially connected with a further diode having a flow direction which is opposite that of said Zener diode.

* * * * *